United States Patent
Seo

(10) Patent No.: US 8,347,171 B2
(45) Date of Patent: Jan. 1, 2013

(54) SEMICONDUCTOR MEMORY DEVICE CAPABLE OF REDUCING CURRENT IN PASR MODE

(75) Inventor: Eunsung Seo, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 339 days.

(21) Appl. No.: 12/815,114

(22) Filed: Jun. 14, 2010

(65) Prior Publication Data

US 2011/0004805 A1 Jan. 6, 2011

(30) Foreign Application Priority Data

Jul. 3, 2009 (KR) .................. 10-2009-0060842

(51) Int. Cl.
*H03M 13/00* (2006.01)
*G11C 29/00* (2006.01)

(52) U.S. Cl. ........................... 714/754; 714/763
(58) Field of Classification Search ............... 714/754, 714/763, 764
See application file for complete search history.

(56) References Cited

U.S. PATENT DOCUMENTS

| | | | | |
|---|---|---|---|---|
| 4,319,356 A * | 3/1982 | Kocol et al. | ................ | 714/754 |
| 4,506,362 A * | 3/1985 | Morley | ................ | 714/6.1 |
| 4,701,884 A * | 10/1987 | Aoki et al. | ................ | 365/189.09 |
| 4,758,992 A * | 7/1988 | Taguchi | ................ | 365/222 |
| 5,745,508 A * | 4/1998 | Prohofsky | ................ | 714/766 |
| 6,161,208 A * | 12/2000 | Dutton et al. | ................ | 714/764 |
| 7,032,142 B2 * | 4/2006 | Fujioka et al. | ................ | 714/718 |
| 7,184,352 B2 * | 2/2007 | Klein et al. | ................ | 365/222 |
| 7,249,289 B2 * | 7/2007 | Muranaka et al. | ................ | 714/48 |
| 7,350,137 B2 * | 3/2008 | Foss et al. | ................ | 714/805 |
| 7,477,563 B2 * | 1/2009 | Kang et al. | ................ | 365/222 |
| 7,565,593 B2 * | 7/2009 | Dixon et al. | ................ | 714/754 |
| 7,894,282 B2 * | 2/2011 | Pyo et al. | ................ | 365/200 |
| 8,024,638 B2 * | 9/2011 | Resnick et al. | ................ | 714/758 |
| 8,042,022 B2 * | 10/2011 | Ito et al. | ................ | 714/764 |
| 2003/0046630 A1 * | 3/2003 | Hilbert | ................ | 714/763 |
| 2004/0205426 A1 * | 10/2004 | Muranaka et al. | ................ | 714/704 |
| 2006/0282755 A1 * | 12/2006 | Oh | ................ | 714/801 |
| 2007/0079218 A1 | 4/2007 | Nagai et al. | | |
| 2007/0133331 A1 | 6/2007 | Park et al. | | |
| 2007/0162826 A1 * | 7/2007 | Major et al. | ................ | 714/763 |

(Continued)

FOREIGN PATENT DOCUMENTS

JP 2007-087435 4/2007

(Continued)

OTHER PUBLICATIONS

English Abstract for Publication No. 10-0644223, Pub.Date, Nov. 2, 2006.

(Continued)

*Primary Examiner* — James C Kerveros
(74) *Attorney, Agent, or Firm* — F. Chau & Associates, LLC

(57) ABSTRACT

A semiconductor memory device capable of reducing current consumption in a partial-array self-refresh (PASR) mode includes a plurality of banks and at least one parity bank. A specific area to be self-refreshed is individually selected from each of some banks selected out of the plurality of banks to perform a self-refresh operation. Data of the specific area to be self-refreshed is verified using an error correction code (ECC) stored in the parity bank.

18 Claims, 5 Drawing Sheets

U.S. PATENT DOCUMENTS

2009/0193301 A1* 7/2009 Ito et al. .......................... 714/704
2010/0205504 A1* 8/2010 Fung et al. ..................... 714/752
2011/0060961 A1* 3/2011 Klein ............................. 714/754

FOREIGN PATENT DOCUMENTS

| JP | 2007-157316 | 6/2007 |
|---|---|---|
| KR | 10-0644223 | 11/2006 |
| KR | 10-0852191 | 8/2008 |

OTHER PUBLICATIONS

English Abstract for Publication No. 2007-087435, Pub.Date, Apr. 5, 2007.
English Abstract for Publication No. 2007-157316, Pub. Date, Jun. 21, 2007.
English Abstract for Publication No. 10-0852191 Pub. Date, Aug. 7, 2008.

* cited by examiner

SEMICONDUCTOR MEMORY DEVICE CAPABLE OF REDUCING CURRENT IN PASR MODE

CROSS-REFERENCE TO RELATED APPLICATION

This application claims the benefit under 35 U.S.C. §119 of Korean Patent Application No. 10-2009-0060842, filed on Jul. 3, 2009, the contents of which are herein incorporated by reference in their entirety.

BACKGROUND

1. Technical Field

Exemplary embodiments of the present invention relate to a semiconductor memory device, and more particularly, to a semiconductor memory device capable of reducing current in a partial array self-refresh (PASR) mode.

2. Description of Related Art

A semiconductor memory device, such as a dynamic random access memory (DRAM), may periodically perform a refresh operation in order to prevent data loss due to, for example, charge leak in memory capacitors. The semiconductor memory device may consume a large current during the refresh operation. Particularly, current consumed by the semiconductor memory device during a self-refresh operation in which a refresh operation is performed at predetermined time intervals in a standby or power-down mode may represent a large portion of the entire current consumption. Accordingly, when the semiconductor memory device is implemented in a portable apparatus that is significantly affected by current consumption, it is necessary to reduce current consumption during the self-refresh operation.

As the capacity of semiconductor memory devices has increased, a multi-bank semiconductor memory device including a plurality of banks has conventionally been adopted. In order to reduce current consumption during a self-refresh operation of a multi-bank semiconductor memory device, a partial array self-refresh (PASR) method has been proposed. The PASR method may involve refreshing less than all memory cells of a semiconductor memory device.

A typical PASR operation includes self-refreshing individual banks. For example, when a multi-bank semiconductor memory device including a plurality of banks enters a PASR mode, only some banks of the plurality of banks may be self-refreshed, while the remaining banks may not be self-refreshed. In this case, banks that are not self-refreshed may lose data, thereby reducing current consumption.

A method of dividedly storing data in a plurality of banks instead of storing the data in bank units has been adopted in order to improve data input/output operations. In this case, a data read/write operation includes sequentially activating banks while changing bank addresses to increase the operating speed of a semiconductor memory device more than a data read/write operation including changing word lines of one bank.

SUMMARY

According to exemplary embodiments, a semiconductor memory device includes a plurality of banks, each bank including at least one block including a plurality of memory cells, a parity bank including a plurality of parity memory cells, a refresh unit configured to generate a refresh address to perform a self-refresh operation on the plurality of memory cells included in a selected block of each of banks designated by a mode register set (MRS) code, in response to a self-refresh mode signal, an address mapping unit configured to output a match signal and a parity address along with an externally applied address when the externally applied address is an address for designating the selected block during a read/write operation, and an error code generation/correction unit configured to generate an error correction code for externally applied data in response to the match signal and a write signal and store the error correction code in a parity memory cell of the plurality of parity memory cells corresponding to the parity address of the parity bank.

The MRS code may individually designate the blocks including the memory cells to be self-refreshed.

The MRS code may discretely set the blocks to be self-refreshed.

The refresh unit may include a register unit configured to externally receive the MRS code in response to a MRS signal and store the MRS code; and a refresh controller configured to confirm whether the MRS code is set to a partial self-refresh operation in response to the self-refresh mode signal, receive partial self-refresh area information indicating the banks or the selected block of each of the designated banks by the MRS code, and generate and output a refresh bank address and a refresh row address corresponding to the partial self-refresh area information during the self-refresh operation.

The address mapping unit may receive the self-refresh area information from the register unit, generate, store, and output the match signal and the parity address mapped with the address when the address applied with the write signal is an address corresponding to the partial self-refresh area information, and output the match signal and the parity address mapped with the stored address when the address applied with a read signal is an address corresponding to the partial self-refresh area information.

The error code generation/correction unit may verify and correct data, which is applied from the bank, using the error correction code, which is applied from the parity bank, in response to the read signal and outputs verified and corrected data.

The semiconductor memory device may further include a command decoder configured to decode an externally applied command and output the MRS signal, the self-refresh mode signal, the read signal, and the write signal, a plurality of row decoders configured to activate a word line of the corresponding one of the plurality of banks in response to the refresh row address, a bank selector configured to activate the corresponding one of the plurality of row decoders in response to the refresh bank address, a parity row decoder configured to activate a word line of the parity bank in response to the parity address; and a column decoder configured to select sense amplifiers of the corresponding bank and the parity bank in response to a column address.

When a plurality of parity banks are provided, the semiconductor memory device may further include a parity bank selector configured to select one of the plurality of parity banks in response to the parity address.

The semiconductor memory device may further include a data input/output (I/O) buffer unit configured to buffer the externally applied data and apply buffered data to the error code generation/correction unit in response to the write signal and externally output the data from the error code generation/correction unit in response to the read signal.

A partial array self-refresh method performed by a semiconductor memory device having a plurality of banks, each bank including at least one block including a plurality of memory cells and a parity bank including a plurality of parity memory cells, the method comprising generating a refresh address to perform a self-refresh operation on the plurality of memory cells included in a selected block of each of banks designated by a mode register set (MRS) code, in response to a self-refresh mode signal, outputting a match signal and a parity address along with an externally applied address when the externally applied address is an address for designating the selected block during a read/write operation, and generating an error correction code for externally applied data in response to the match signal and a write signal and store the error correction code in a parity memory cell of the plurality of parity memory cells corresponding to the parity address of the parity bank.

BRIEF DESCRIPTION OF THE DRAWINGS

Exemplary embodiments are described in further detail below with reference to the accompanying drawings. It should be understood that various aspects of the drawings may have been exaggerated for clarity.

DETAILED DESCRIPTION OF THE EMBODIMENTS

Various exemplary embodiments will now be described more fully with reference to the accompanying drawings in which exemplary embodiments are shown. However, specific structural and functional details disclosed herein are merely representative for purposes of describing exemplary embodiments. The inventive concepts, however, may be embodied in many alternate forms and should not be construed as limited to only exemplary embodiments set forth herein.

Figure 1:
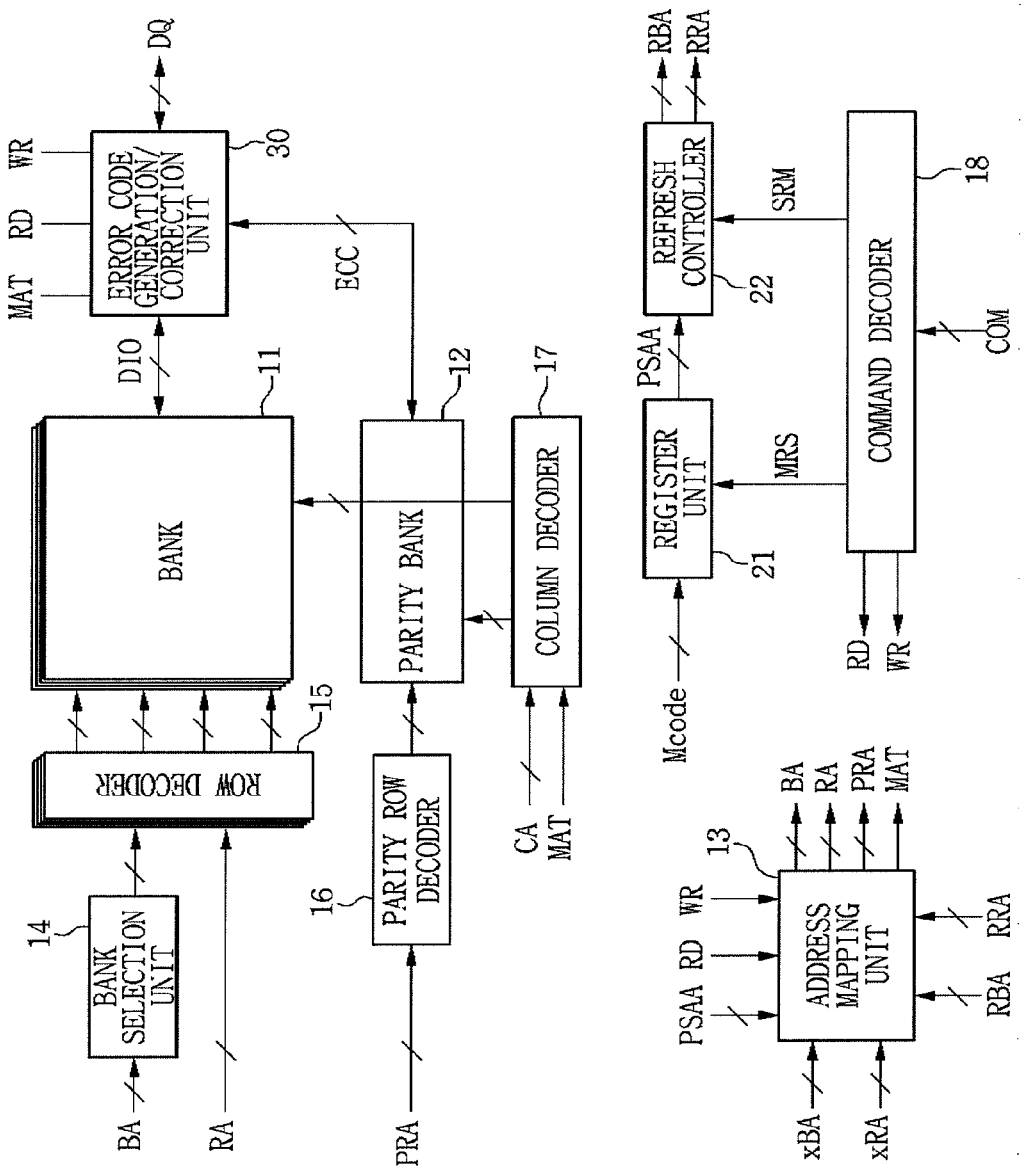
FIG. 1 is a diagram of a semiconductor memory device according to exemplary embodiments.

FIG. 1 is a diagram of a semiconductor memory device according to exemplary embodiments.

A plurality of banks 11 may include a plurality of word lines (not shown), a plurality of bit lines (not shown), and a plurality of memory cells (not shown) connected respectively between the word lines and the bit lines. The plurality of banks 11 may include a plurality of sense amplifiers (not shown) connected to the plurality of bit lines, respectively, in order to sense and amplify data stored in the plurality of memory cells. At least one parity bank 12 may include a plurality of word lines (not shown), a plurality of bit lines (not shown), and a plurality of parity memory cells (not shown) connected respectively between the word lines and the bit lines. The at least one parity bank 12 may include a plurality of sense amplifiers (not shown) connected to the plurality of bit lines, respectively, in order to sense and amplify data stored in the plurality of parity memory cells.

A bank selection unit 14 may select one out of a plurality of row decoders 15 in response to a bank address BA applied from an address mapping unit 13 and activate the selected row decoder 15. The row decoder 15 selected by the bank selection unit 14 may receive a row address RA applied from the address mapping unit 13, decode the row address RA, and activate a specific word line of the corresponding one of the plurality of banks 11. A parity row decoder 16 corresponding to the parity bank 12 may activate a specific word line of the parity bank 12 in response to a parity row address PRA applied from the address mapping unit 13. Although FIG. 1 illustrates the semiconductor memory device including the plurality of row decoders 15 corresponding respectively to the plurality of banks 11, a single row decoder 15 may be shared among a predetermined number of banks 11 (e.g., two banks).

A column decoder 17 may receive a column address CA from externally applied addresses, decode the column address CA, and select the sense amplifier of the corresponding one of the plurality of banks 11. When a match signal MAT is activated, the column decoder 17 may select the sense amplifier of the corresponding one of the plurality of banks 11 and simultaneously select the corresponding one of the plurality of sense amplifiers of the parity bank 12. That is, when the match signal MAT is activated, the column decoder 17 may select the sense amplifier of the parity bank 12 along with the sense amplifier of the bank 11. Although FIG. 1 illustrates only one column decoder 17, the semiconductor memory device may include a plurality of column decoders so that one column decoder 17 may be shared among a predetermined number of banks 11 (e.g., two banks).

A command decoder 18 may decode an externally applied command COM, output a mode register set (MRS) signal for setting the mode of the semiconductor memory device to a register unit 21, and output a self-refresh mode (SRM) signal to a refresh controller 22 in a self-refresh mode.

The register unit 21 may receive and store a MRS code Mcode for setting operations of the semiconductor memory device in response to the MRS signal. Here, the MRS code Mcode may be applied as an address or data type to the register unit 21. The MRS code Mcode stored in the register unit 21 may include partial self-refresh area information PSAA for designating the bank 11 to be partial-array self-refreshed and a specific area of each of the banks 11 to be refreshed. The partial self-refresh area information PSAA may be varied among the banks 11. When each of the banks 11 include a plurality of blocks, the partial self-refresh area information PSAA on each of the banks 11 may be set to at least one block of the corresponding bank 11.

TABLE 1

| Code | | Bank | | | Banks or Blocks of each bank | | | | | | | |
|---|---|---|---|---|---|---|---|---|---|---|---|---|
| OP12 | OP11 | OP10 | OP9 | OP8 | OP7 | OP6 | OP5 | OP4 | OP3 | OP2 | OP1 | OP0 |
| 1 | 0 | X | X | X | 0 | 1 | 0 | 1 | 0 | 0 | 1 | 0 |
| 1 | 1 | 0 | 0 | 1 | 0 | 1 | 0 | 0 | 1 | 0 | 0 | 1 |
| 1 | 1 | 1 | 0 | 0 | 0 | 0 | 0 | 0 | 0 | 0 | 1 | 0 |
| 1 | 1 | 1 | 1 | 0 | 1 | 0 | 0 | 0 | 0 | 1 | 0 | 1 |

Table 1 shows an example of the MRS code Mcode stored in the register unit 21.

In Table 1, codes OP11 and OP12 may indicate classification of the MRS code Mcode, and the code OP12 may indicate whether the semiconductor memory device is to perform a whole self-refresh operation or a PASR operation. In Table 1, when the code OP12 is set to 1, it is assumed that the semiconductor memory device performs the PASR operation.

The code OP11 may indicate whether codes OP0 to OP10 designate banks 11 or blocks of each of the banks 11 to be partial self-refreshed. When the code OP11 is 0, codes OP0 to OP10 may select banks to be partial self-refreshed, and when the code OP11 is 1, codes OP0 to OP10 may select blocks of each of the banks 11 to be partial self-refreshed. The codes OP8 to OP10 may designate banks 11 to be partial self-refreshed when the code OP11 is 1. The codes OP7 to OP0 may designate respective banks 11 when the code OP11 is 0 and blocks of each of the banks 11 when the code OP11 is 1. In Table 1, when the codes OP11 and OP12 are 10, the codes OP11 and OP12 may designate that the codes OP0 to OP7 indicate banks 11 to be self-refreshed irrespective of values of the codes OP8 to OP10. When the semiconductor memory device includes 8 banks 11, the codes OP7 to OP0 may designate the respective banks 11. In Table 1, since the codes OP1, OP4, and OP6 are set to 1, the codes OP1, OP4, and OP6 may indicate that second, fifth, and seventh banks 11 are self-refreshed during the PASR operation.

When the codes OP11 and OP12 are 11, the codes OP11 and OP12 may indicate that the codes OP0 to OP10 indicate the blocks of each of the banks 11 to be self-refreshed, and the codes OP8 to OP10 may designate banks 11 having designated blocks. As described above, when the second, fifth, and seventh banks 11 are self-refreshed, the codes OP8 to OP10 may be denoted by (001, 100, and 110), respectively. In Table 1, it is assumed that each of the plurality of banks 11 include eight blocks. When the codes OP8 to OP10 are 001, the codes OP0 to OP7 may be "01001001" so that blocks of the second bank 11 to be self-refreshed may be first, fourth, and seventh blocks. When the codes OP8 to OP10 are 110, the codes OP0 to OP7 may be "10000101" so that blocks of the seventh bank 11 to be self-refreshed may be first, third, and eighth blocks.

Since Table 1 shows only one example of the MRS code Mcode, the partial self-refresh area information PSAA may be set by a start address and an end address in which the PASR operation of each of the banks 11 will be performed. Even if the partial self-refresh area information PSAA is set not in block units but by the start and end addresses, the partial self-refresh area information PSAA may be set by a plurality of start addresses and a plurality of end addresses per bank so that each of the banks 11 may include a plurality of self-refresh areas. That is, in the semiconductor memory device according to the exemplary embodiments, the register unit 21 may not only store information on banks 11 to be partial-array self-refreshed but also individually store areas of a memory cell to be partial-array self-refreshed within the banks 11 to be partial-array self-refreshed.

When the self-refresh mode signal SRM is activated, the refresh controller 22 may confirm whether or not the MRS code Mcode stored in the register unit 21 designates a PASR mode. Thus, when the MRS code Mcode is set to the PASR mode, the refresh controller 22 may receive partial self-refresh area information PSAA about each bank. The refresh controller 22 may generate and output a refresh bank address RBA and a refresh row address RRA based on the received partial self-refresh area information PSAA. When the semiconductor memory device enters the self-refresh mode, even if no external command is applied, the refresh controller 22 may periodically perform a refresh operation. When the MRS code Mcode stored in the register unit 21 is not set to the PASR mode, the refresh controller 22 may generate the refresh bank address RBA and the refresh row address RRA such that all memory cells of all the banks 11 are refreshed. When the MRS code Mcode stored in the register unit 21 is set to the PASR mode, the refresh controller 21 may generate only the refresh bank address RBA and the refresh row address RRA for a PASR area set by the MRS code Mcode. Since the refresh operation is performed in units of word lines, no column address CA for the refresh operation may be generated.

The address mapping unit 13 may receive the partial self-refresh area information PSAA from the register unit 21, generate a parity address corresponding to the refresh bank address RBA and the refresh row address RRA for the PASR area, and store mapping information. In other words, the address mapping unit 13 may store an address for a memory cell corresponding to the self-refresh area and the parity row address PRA mapped with each address. The address mapping unit 13 may receive an external bank address xBA and an external row address xRA from externally applied addresses in response to a read signal RD or a write signal WR during a read or write operation, output the bank address BA to the bank selection unit 14, and output the row address RA to the row decoder 15. The address mapping unit 13 may compare the external bank address xBA with the partial self-refresh area information PSAA. When the external bank address xBA and the external row address xRA are in the area set by the self-refresh area information PSAA, the address mapping unit 13 may activate and output the match signal MAT and output the parity row address PRA mapped with the applied external bank address xBA and external row address xRA to the parity row decoder 16 in order to select a memory cell of the parity bank 12. In the self-refresh mode, the address mapping unit 13 may receive the refresh bank address RBA and the refresh row address RRA from the refresh controller 22, output the bank address BA to the bank selection unit 14, and output the row address RA to the row decoder 15.

When a write command WR is applied along with the match signal MAT, an error code generation/correction unit 30 may generate an error correction code (ECC) in response to data DQ, wherein the data DQ is externally applied through a data input/output (I/O) buffer (not shown), output the ECC to the parity bank 12, and apply input data DI to the banks 11. When a read command RD is applied along with the match signal MAT, the error generation/correction unit 30 may receive the ECC and output data DO from the parity bank 12 and the banks 11, respectively, verify the output data DO, corrects errors, and externally output the data DQ.

The semiconductor memory device of FIG. 1 may selects at least one of the plurality of banks 11, and may partial-array self-refresh a designated area of the selected bank 11. Thus, a user may directly designate an area to be partial-array self-refreshed. The semiconductor memory device of FIG. 1 may include the error generation/correction unit 30, which may generate the ECC and store the ECC in the parity bank 12 during the write operation of the designated area and verify and correct the data DQ using the ECC stored in the parity bank 12 during the read operation to enable the PASR operation.

Therefore, even if the PASR operation is performed for a much longer period than when data verification/correction operations are omitted, no malfunction may occur in the semiconductor memory device. As a result, power consumption may be reduced. Since in the plurality of banks 11 only selected areas of selected banks are self-refreshed and the data verification/correction operations are performed only on the self-refreshed areas, the size of the parity bank 12 needed for storing the ECC may be reduced.

According to an exemplary embodiment, a system including a semiconductor memory device may operate using an operation system (OS) program. The OS program and data used by the OS program need to be maintained. The OS program and the data used by the OS program may be stored in a specific area of a bank of the semiconductor memory device according to the design of the OS program and stored in different areas according to each OS. Thus, when a self-refresh area is determined in advance, the semiconductor memory device including the self-refresh area may not correspond to a device used to store the OS program. Therefore, according to exemplary embodiments of the present invention, the self-refresh area may be designated in response to an external address.

FIGS. 2 through 5 are diagrams illustrating the self-refresh operation of the bank of FIG. 1, according to exemplary embodiments. The self-refresh operation will now be described with reference to FIGS. 2 through 5 in the context of an exemplary semiconductor memory device including 4 banks.

Figure 2:
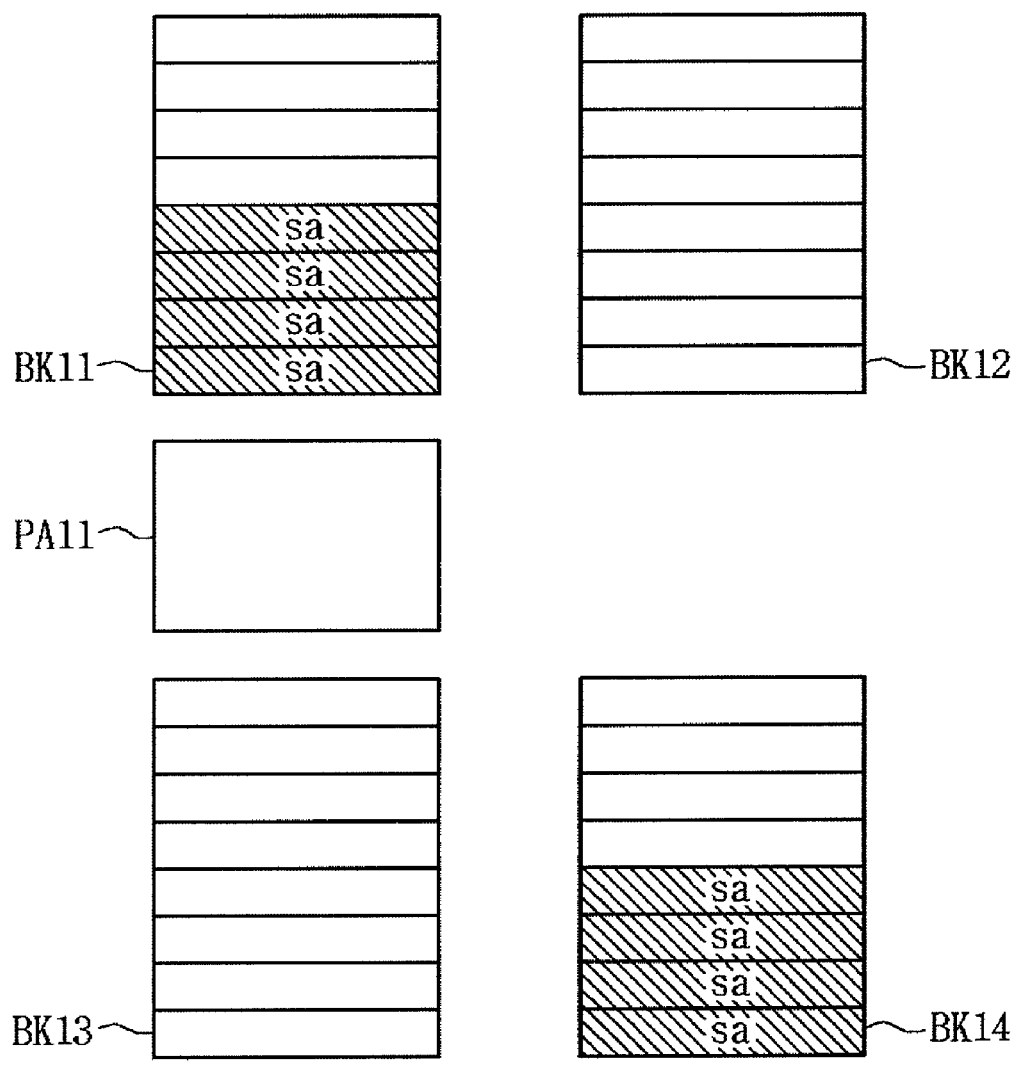
FIGS. 2 through 5 are diagrams illustrating a self-refresh operation of a bank of FIG. 1, according to exemplary embodiments.

FIG. 2 illustrates a semiconductor memory device including first through fourth banks BK11 to BK14 and a single parity bank PA11. Although the parity bank PA11 may have the same size as each of the first through fourth banks BK11 to BK14, FIG. 2 illustrates that the parity bank PA11 has half the size of each the first through fourth banks BK11 to BK14.

As the number of correctable bits increases, the ECC may also increase. For example, a 4-bit (50%) ECC may be needed to correct a 1-bit error in 8-bit data, while a 7-bit (about 10%) ECC may be needed to correct a 1-bit error in 64-bit data. That is, as the number of correctable bits for equal-bit data increases, the number of bits of the ECC may also increase. Thus, when the semiconductor memory device enters a full self-refresh mode, since data to be corrected by an error code generation/correction unit 30 increases, the size of the parity bank PA11 needs to be increased. The parity bank PA11 is not a memory cell array for data, so an increase in the size of the parity bank PA11 may be a loss to the semiconductor memory device. Accordingly, the size of the parity bank PA11 needs to be reduced, thus resulting in a reduction in the number of correctable bits. The reduction in the number of correctable bits may lead to degradation of error correctability, thus precluding increasing a self-refresh period and permitting current consumption to increase.

Referring to FIG. 2, a self-refresh area SA may be set to only the first and fourth banks BK11 and BK14. The self-refresh area SA may correspond to four blocks of each of the first and fourth banks BK11 and BK14, that is, the half area of each of the first and fourth banks BK11 and BK14. In this case, the entire self-refresh area SA may have the same size as one of the banks BK11 to BK14. Since only 50% ECC data is needed to correct the 1-bit error in the 8-bit data as described above, even if the parity bank PA11 has only half the size of each of the banks BK11 to BK14, error correctability may be increased, and the refresh period may be increased.

Figure 3:
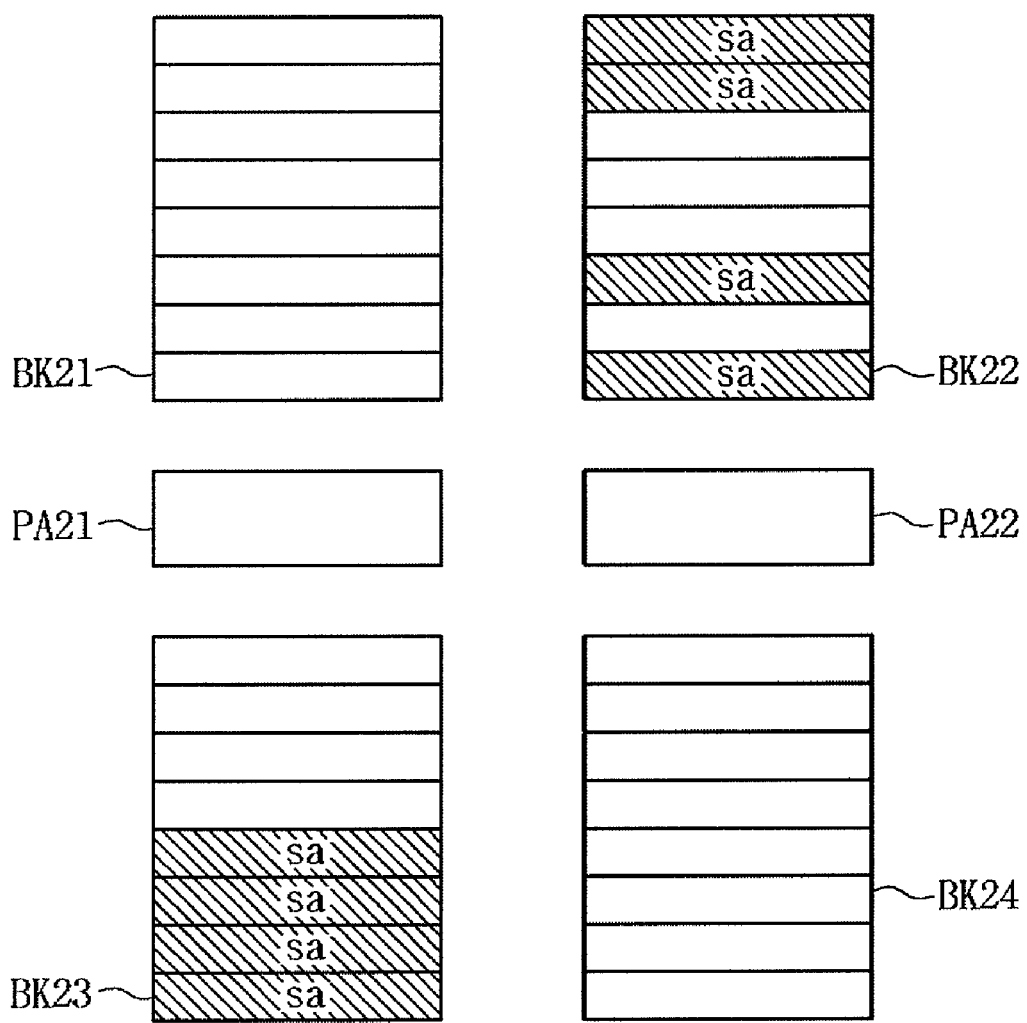

FIG. 3 illustrates a semiconductor memory device including two parity banks PA21 and PA22. Each of the parity banks PA21 and PA22 may have half the size of the parity bank PA11 of FIG. 1, and the sum of the sizes of the parity banks PA21 and PA22 may be equal to the size of the parity bank PA11. Thus, although the semiconductor memory device of FIG. 3 includes the two parity banks PA21 and PA22, the semiconductor memory device of FIG. 3 may correct errors in the same manner as the semiconductor memory device of FIG. 2, which includes one parity bank PA11.

In this case, the two parity banks PA21 and PA22 may be used in common as banks in which the ECC for correcting data of the self-refresh area SA is stored. Specifically, since the error code generation/correction unit 30 of FIG. 1 stores parity addresses of the parity banks PA21 and PA22 mapped with an address of the self-refresh area SA, an ECC corresponding to one of the two parity banks PA21 and PA22 may be stored irrespective of the position of the self-refresh area SA. Error correction speed may be increased in substantially the same manner as when data read/write speed is increased by reading or writing data while changing bank addresses. FIG. 3 illustrates that the self-refresh area SA may be set to respectively different areas even in the second and third banks BP22 and BK23. Furthermore, the self-refresh area SA may be freely set as in the third bank BK23.

Figure 4:
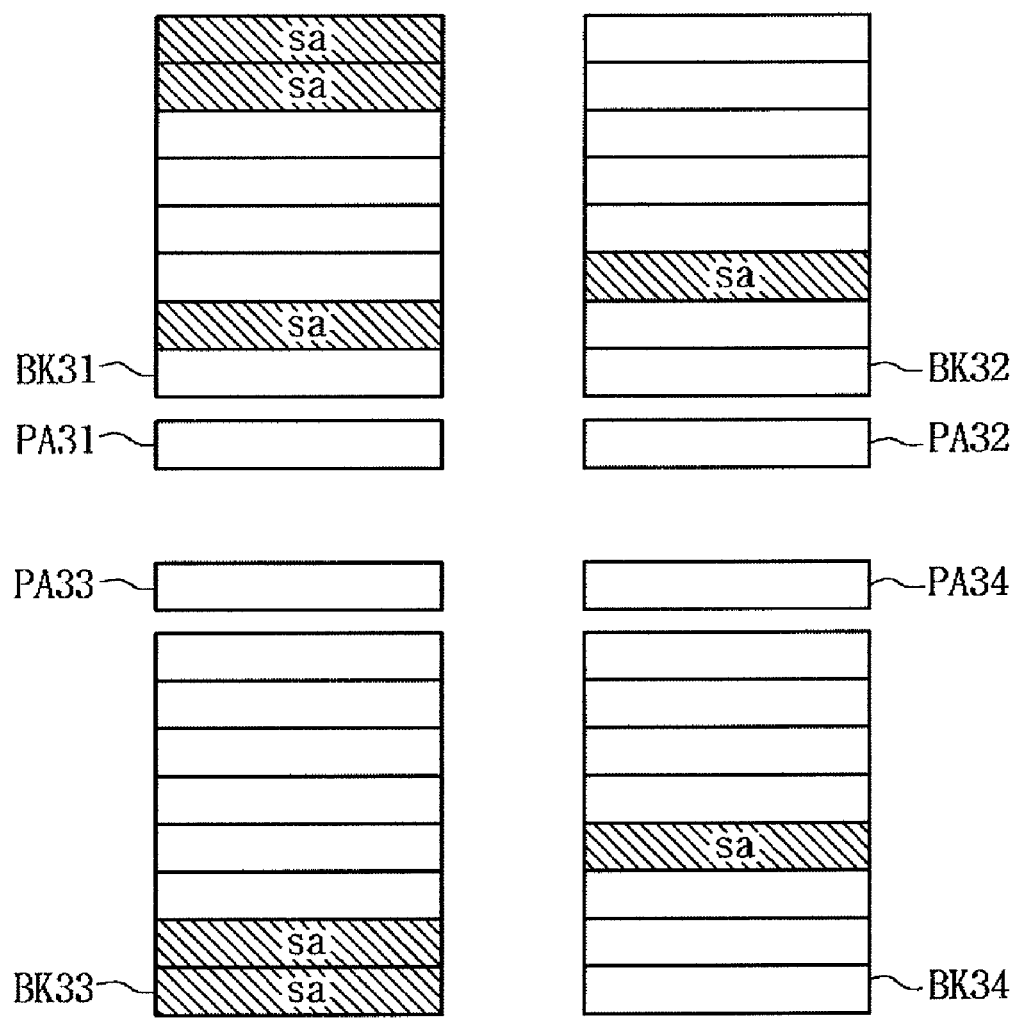

FIG. 4 illustrates a semiconductor memory device including four banks BK31 to BK34 and four parity banks PA31 to PA34.

Figure 5:
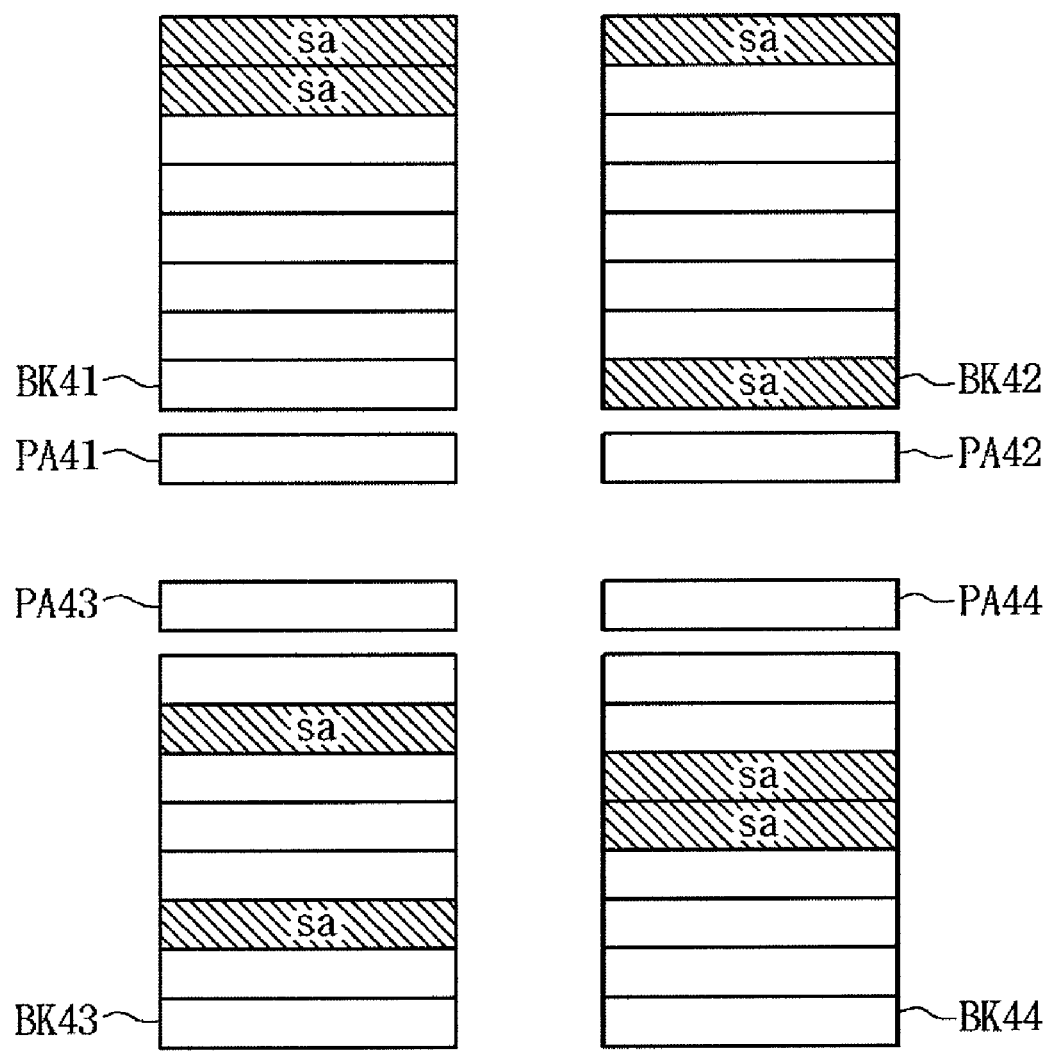

Referring to FIG. 4, various numbers of self-refresh areas SA may be designated as respectively different blocks in the four banks BK31 to BK34. FIG. 5 illustrates another example of a semiconductor memory device including four banks BK41 to BK44 and four parity banks PA41 to PA44.

Although each of FIGS. 2 through 5 illustrates that the sum of the sizes of the parity banks PA11, PA21, PA22, PA31 to PA34, and PA41 to PA44 is equal to half the size of one of the corresponding banks BK11 to BK14, BK21 to BK24, BK31 to BK34, and BK41 to BK44, the sizes of the parity banks PA11, PA21, PA22, PA31 to PA34, and PA41 to PA44 may be freely controlled. Similarly, the sum of the sizes of the self-refresh areas SA may be freely controlled. However, the sizes of the self-refresh areas SA may be controlled considering that the sizes of the self-refresh areas SA and the sizes of the parity banks PA11 PA21, PA22, PA31 to PA34, and PA41 to PA44 are associated with error controllability.

Furthermore, the number of banks and the number of the parity banks are not limited to exemplary embodiments of FIGS. 2 through 5.

Although it is described above that the refresh bank address RBA and the refresh row address RRA are transmitted from the refresh controller 22 to the address mapping unit 13, the refresh bank address RBA and the refresh row address RRA may be directly applied to the bank selection unit 14 and the row decoder 15, respectively.

Although it is described above that a semiconductor memory device generates an ECC or performs an error correction operation during a read/write operation, the semiconductor memory device may generate the ECC or perform the error correction operation during a self-refresh operation. In order to generate the ECC or perform the error correction operation during the self-refresh operation, the address mapping unit 13 may generate the match signal MAT and the parity row address PRA in response to the refresh bank address RBA and the refresh row address RRA.

Although it is described above that the column decoder 17 directly receives the column address CA, the address mapping unit 13 may receive the column address CA and transmit the column address CA to the column decoder 17.

According to the exemplary embodiments as described above, a semiconductor memory device can include a plurality of banks and at least one parity bank. A refresh operation can be performed by selecting some of a plurality of banks and freely selecting a specific area of each of the selected banks to be self-refreshed, thereby promoting the convenience of a PASR operation and reducing power consumption. A self-refresh period of the specific area to be self-refreshed can be increased, thereby minimizing current consumption. Furthermore, since parity data corresponding to only the specific area to be self-refreshed is needed, the size of a parity bank can be reduced.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings, and advantages. Accordingly, all such modifications are intended to be included within the scope of this inventive concept as defined in the claims. For example, exemplary embodiments can be applied to a measurement method for monitoring process variation in semiconductor equipment. In the claims, means-plus-function clauses are intended to cover the structures described herein as performing the recited function, and not only structural equivalents but also equivalent structures. Therefore, it is to be understood that the foregoing is illustrative of various exemplary embodiments and is not to be construed as limited to the specific embodiments disclosed, and that modifications to the disclosed embodiments, as well as other embodiments, are intended to be included within the scope of the appended claims.

What is claimed is:

1. A semiconductor memory device comprising:
    a plurality of banks, each bank including at least one block including a plurality of memory cells;
    a parity bank including a plurality of parity memory cells;
    a refresh unit configured to generate a refresh address to perform a self-refresh operation on the plurality of memory cells included in a selected block of each of banks designated by a mode register set (MRS) code, in response to a self-refresh mode signal;
    an address mapping unit configured to output a match signal and a parity address along with an externally applied address when the externally applied address is an address for designating the selected block during a read/write operation; and
    an error code generation/correction unit configured to generate an error correction code for externally applied data in response to the match signal and a write signal and store the error correction code in a parity memory cell of the plurality of parity memory cells corresponding to the parity address of the parity bank.

2. The device of claim 1, wherein the MRS code is stored in the register unit and individually designates the blocks including the plurality of memory cells to be self-refreshed.

3. The device of claim 2, wherein the MRS code discretely sets the blocks to be self-refreshed.

4. The device of claim 1, wherein the refresh unit comprises:
    a register unit configured to externally receive the MRS code in response to a MRS signal and store the MRS code; and
    a refresh controller configured to confirm whether the MRS code is set to a partial self-refresh operation in response to the self-refresh mode signal, receive partial self-refresh area information indicating the banks designated or the selected block of each of the designated banks by the MRS code, and generate and output a refresh bank address and a refresh row address corresponding to the partial self-refresh area information during the self-refresh operation.

5. The device of claim 4, wherein the address mapping unit receives the partial self-refresh area information from the register unit, generates, stores, and outputs the match signal and the parity address mapped with the address when the address applied with the write signal is an address corresponding to the partial self-refresh area information, and outputs the match signal and the parity address mapped with the stored address when the address applied a read signal is an address corresponding to the partial self-refresh area information.

6. The device of claim 5, wherein the error code generation/correction unit verifies and corrects data, which is applied from the bank, using the error correction code, which is applied from the parity bank, in response to the read signal and outputs verified and corrected data.

7. The device of claim 6, further comprising:
    a command decoder configured to decode an externally applied command and output the MRS signal, the self-refresh mode signal, the read signal, and the write signal;
    a plurality of row decoders configured to activate a word line of the corresponding one of the plurality of banks in response to the refresh row address;
    a bank selector configured to activate the corresponding one of the plurality of row decoders in response to the refresh bank address;
    a parity row decoder configured to activate a word line of the parity bank in response to the parity address; and
    a column decoder configured to select sense amplifiers of the corresponding bank and the parity bank in response to a column address.

8. The device of claim 7, when a plurality of parity banks including the parity bank are provided, further comprising a parity bank selector configured to select one of the plurality of parity banks in response to the parity address.

9. The device of claim 7, further comprising a data input/output (I/O) buffer unit configured to buffer the externally applied data and apply buffered data to the error code generation/correction unit in response to the write signal and externally output the data from the error code generation/correction unit in response to the read signal.

10. A partial array self-refresh method performed by a semiconductor memory device having a plurality of banks, each bank including at least one block including a plurality of memory cells and a parity bank including a plurality of parity memory cells, the method comprising:
    generating a refresh address to perform a self-refresh operation on the plurality of memory cells included in a selected block of each of banks designated by a mode register set (MRS) code, in response to a self-refresh mode signal;
    outputting a match signal and a parity address along with an externally applied address when the externally applied address is an address for designating the selected block during a read/write operation; and
    generating an error correction code for externally applied data in response to the match signal and a write signal and store the error correction code in a parity memory cell of the plurality of parity memory cells corresponding to the parity address of the parity bank.

11. The method of claim 10, wherein the MRS code individually designates the blocks including the plurality of memory cells to be self-refreshed.

12. The method of claim 11, wherein the MRS code discretely sets the blocks to be self-refreshed.

13. The method of claim 10, further comprising:
    confirming whether the MRS code is set to a partial self-refresh operation in response to the self-refresh mode signal;
    receiving partial self-refresh area information indicating the banks designated or the selected block of each of the designated banks by the MRS code; and
    generating a refresh bank address and a refresh row address corresponding to the partial self-refresh area information during the self-refresh operation.

14. The method of claim 13, further comprising:
generating the parity address mapped with an address of the match signal when the address applied with the write signal is an address corresponding to the partial self-refresh area information; and
outputting the match signal and the parity address mapped with the stored address when an address of a read signal is an address corresponding to the partial self-refresh area information.

15. The method of claim 14, further comprising verifying and correcting data, which is applied from the bank, using the error correction code, which is applied from the parity bank, in response to the read signal.

16. The method of claim 15, further comprising:
activating a word line of a corresponding one of the plurality of banks in response to the refresh row address;
activating a row decoder in response to the refresh bank address;
activating a word line of the parity bank in response to the parity address; and
selecting sense amplifiers of the corresponding bank and the parity bank in response to a column address.

17. The method of claim 16, further comprising selecting one of the plurality of parity banks in response to the parity address.

18. The device of claim 16, further comprising buffering the externally applied data and applying buffered data in response to the write signal and externally output the data in response to the read signal.

* * * * *